US007750612B2

(12) United States Patent
Yokosawa (10) Patent No.: US 7,750,612 B2
(45) Date of Patent: Jul. 6, 2010

(54) VOLTAGE-PULSE CONVERTING CIRCUIT AND CHARGE CONTROL SYSTEM

(75) Inventor: Kouji Yokosawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 852 days.

(21) Appl. No.: 11/561,582

(22) Filed: Nov. 20, 2006

(65) Prior Publication Data

US 2007/0115037 A1  May 24, 2007

(30) Foreign Application Priority Data

Nov. 22, 2005  (JP) .............................. 2005-336932

(51) Int. Cl.
  G05F 1/40 (2006.01)
  G05F 1/44 (2006.01)
(52) U.S. Cl. ........................ 323/282; 323/283; 323/284; 323/285
(58) Field of Classification Search ................ 323/282, 323/283, 284, 285
See application file for complete search history.

(56) References Cited

U.S. PATENT DOCUMENTS 6,497,146 B1 * 12/2002 Hobbs et al. ............. 73/504.12
6,510,737 B1 * 1/2003 Hobbs ..................... 73/504.12
6,639,620 B2 * 10/2003 Ishikawa et al. ............ 347/235
2002/0135662 A1 * 9/2002 Komiya et al. ............. 347/235
2003/0067530 A1 * 4/2003 Ishikawa et al. ............ 347/235

FOREIGN PATENT DOCUMENTS

JP      2001-520391 A      10/2001

* cited by examiner

Primary Examiner—Bao Q Vu
(74) Attorney, Agent, or Firm—Sughrue Mion, PLLC (57) ABSTRACT

A voltage-pulse converting circuit according to an embodiment of the invention includes: a first input terminal and a second input terminal applied with an input voltage to be converted into a pulse; an integrator having positive and negative input terminals; an input switching unit switching connection between the first and second input terminal and the positive and negative input terminals of the integrator; and a first comparator comparing a first detection voltage with an output voltage of the integrator and a second comparator comparing a second detection voltage different from the first detection voltage with the output voltage, the input switching unit switching the connection based on a comparison result of the first and second comparators.

19 Claims, 8 Drawing Sheets

VOLTAGE-PULSE CONVERTING CIRCUIT AND CHARGE CONTROL SYSTEM

BACKGROUND OF THE INVENTION

1. Field of the Invention

The present invention relates to a voltage-pulse converting circuit that converts a voltage into a pulse signal by use of an integrator, and a charge control system incorporating the same.

2. Description of Related Art

Secondary batteries (batteries) such as a lithium cell have been used in a digital camera, a notebook PC, or the like. In this case, it is necessary to accurately control a battery power for the purpose of increasing a battery-based usable life as long as possible. To that end, a charge control system controlling the battery power has been generally provided together with a battery. In such charge control system, for example, a charger is connected between both ends of a battery charger completed by connecting plural secondary batteries in series. A current detecting resistor (sensing resistor) detecting charging/discharging current is connected to one terminal of the battery charger, and this sensing resistor converts the charging/discharging current into a voltage. A current accumulating unit (also referred to as "coulomb counter" or "current flow meter") which receives the converted voltage is connected between both ends of the sensing resistor.

When the battery charger is connected with a charger (in case of charge), a current flows from a positive terminal to the secondary battery or the sensing resistor. On the other hand, if the battery charger is not connected with a charger (in case of discharge), a current flows out from the secondary battery.

That is, a current flows through the sensing resistor in opposite directions in accordance with the charging or discharging operation. Assuming that one terminal (on the battery charger side) of the sensing resistor is a CS positive terminal, and the other terminal is a CS negative terminal of the sensing resistor, the CS positive terminal has a positive potential in case of charge and has a negative potential in case of discharge. A voltage generated at the CS positive terminal is about several tens of mV.

As the above coulomb counter, an AD converter or voltage-frequency converting circuit (V-F converter) is used. Here, the V-F converter converts a voltage detected by the sensing resistor into a frequency pulse, and the pulses are added up by a counter to thereby evaluate the integral of the current based on a count value per unit time. According to this method, all circuits but the counter are analog circuits, and current amounts are continuously accumulated. Therefore, this method is advantageous in that a current conversion rate is high to enable accurate accumulation and a wide dynamic range as compared with the AD converter system.

Regarding the battery power control of the battery charger, the coulomb counter (hereinafter referred to as "V-F converter") measures historical data of the charge/discharge current to grasp a current battery power of the battery charger.

In this example, if a coulomb counter intended to monitor charging/discharging of the battery charger (battery) is made up of the V-F converter, a voltage across the sensing resistor series-connected with the battery is converted into a pulse signal by use of the integrator, and the number of pulse signals is counted. Then, a current charge amount or discharge amount can be calculated based on the count value. At the same time, it is necessary to determine whether charge or discharge is executed depending on whether a positive or negative voltage is input to the V-F converter. Incidentally, it is difficult to determine whether the input voltage is a positive or negative voltage only by configuring the V-F converter. To that end, the circuit should be additionally provided with a charging pump and a comparator for determining whether the input voltage is a positive or negative voltage. Incidentally, it is possible to calculate an accumulated or released amount (mC) of charges per clock pulse based on the number or pulses and the result of determining whether charge or discharge is executed, and a current battery power of the battery charger can be derived from the count value of the pulses.

As an example of the above circuit, a voltage-frequency converter (V-F converter) used as a rechargeable battery monitor monitoring a charging current supplied to a rechargeable battery and a discharging current supplied from the rechargeable battery is disclosed in Japanese Patent Translation Publication No. 2001-520391 (Mader et al.).

Figure 7:
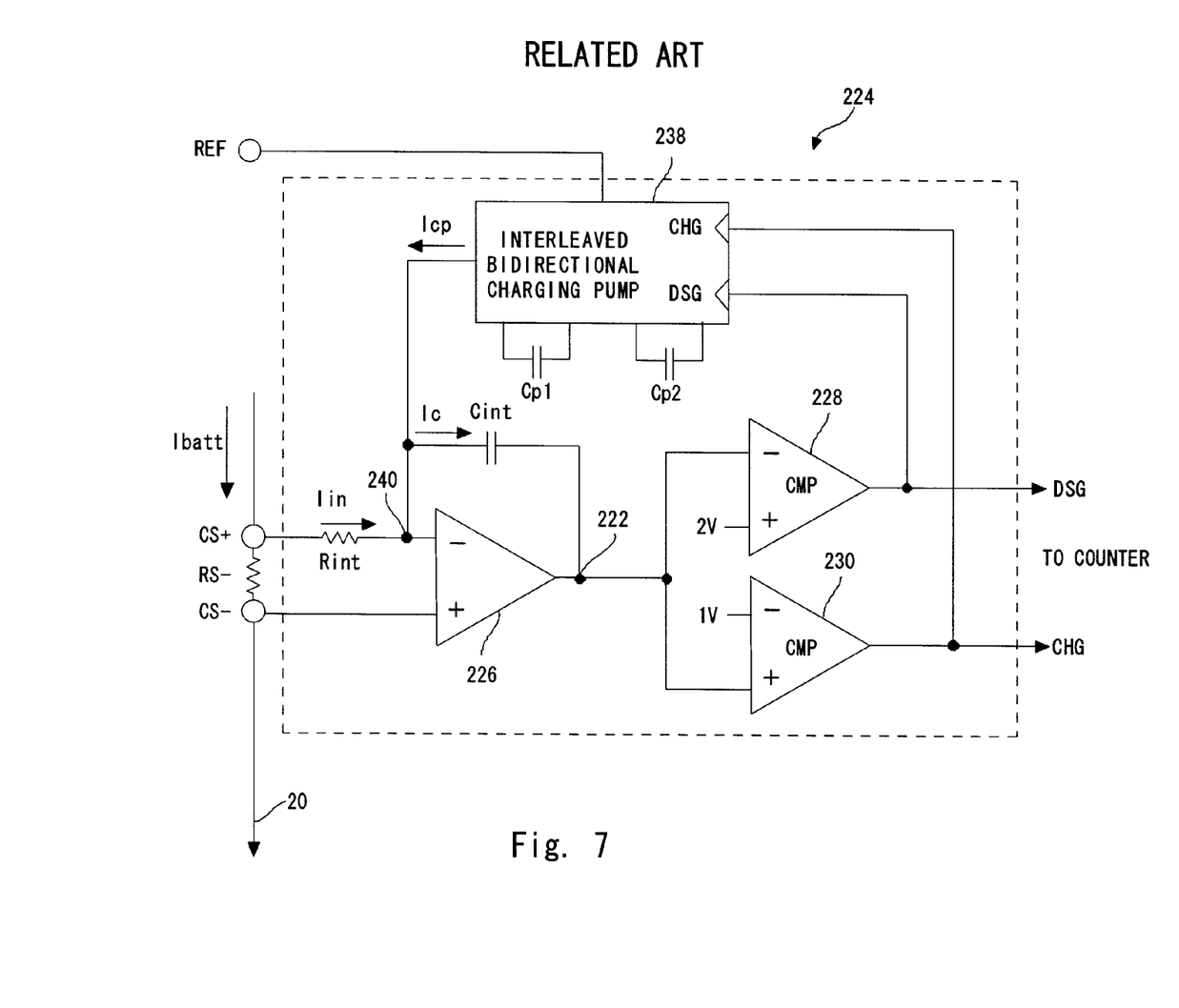
FIG. 7 is a block diagram of the voltage-frequency converter disclosed by Mader et al.
Figure 8:
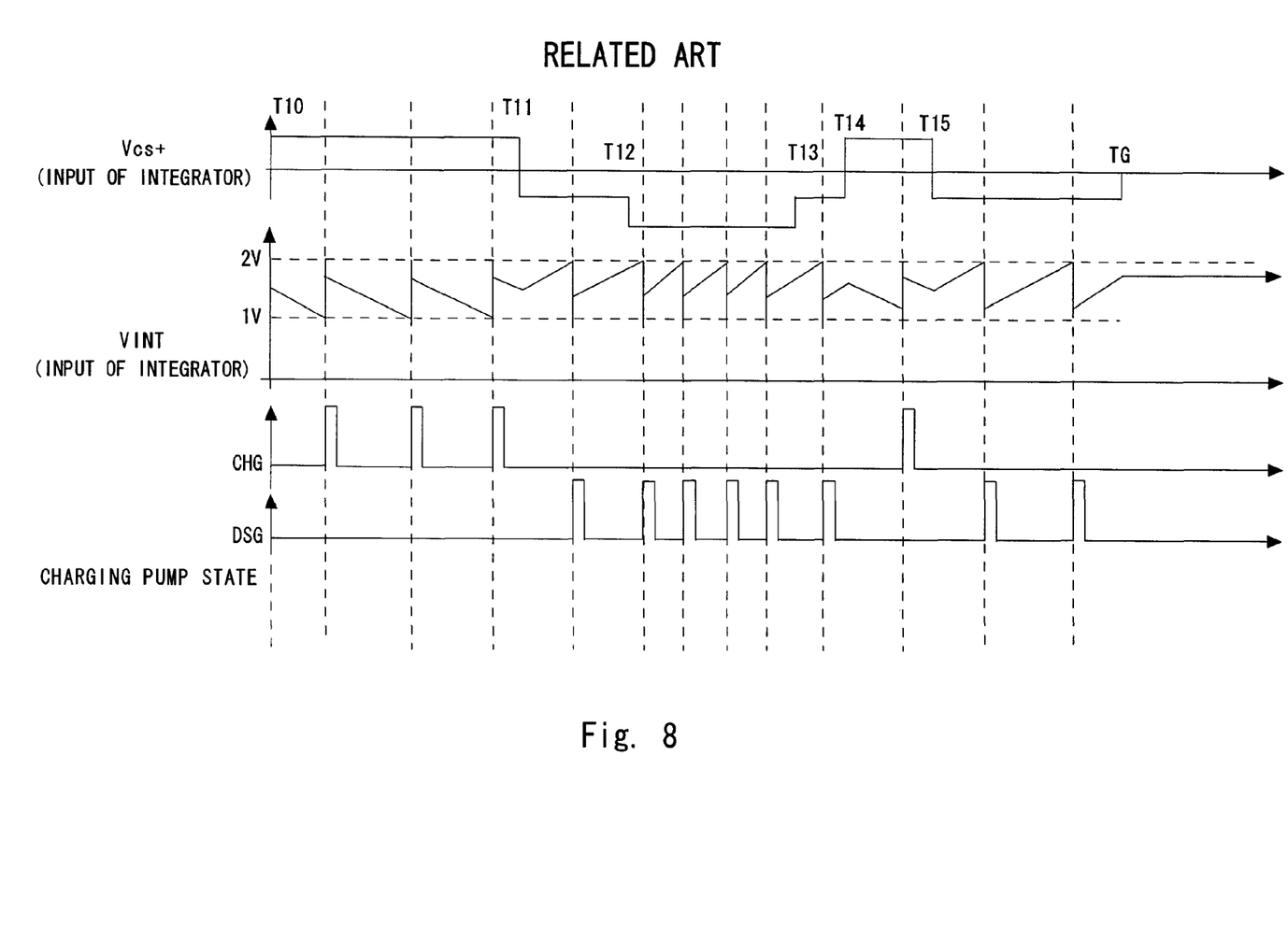
FIG. 8 shows an operational waveform of the voltage-frequency converter disclosed by Mader et al.

FIG. 7 is a block diagram of the voltage-frequency converter disclosed by Mader et al. FIG. 8 shows an operational waveform thereof. In a V-F converter 224, one terminal of a battery is connected with a ground 220 of the system through a sensing resistor RS. A battery-side terminal of the sensing resistor RS (CS positive terminal) is connected with the battery. At the time of charging the battery, the sensing resistor RS flows from the CS positive terminal toward the CS negative terminal. In case of discharge, the sensing resistor RS flows from the CS negative terminal toward the CS positive terminal. A voltage across the sensing resistor RS is an input voltage of the V-F converter 224.

The V-F converter 224 includes an integrator, comparators 228 and 230 comparing an output voltage of the integrator with a reference voltage, and an interleaved bidirectional electric pump 238. The integrator includes a resistor Rint, a capacitor Cint having a capacity of, for example, 36 pF, and a differential amplifier 226. An output voltage (voltage at a node 222) VINT of the integrator lowers, that is, shows downward-sloping curve in FIG. 8 if an input voltage Vsc+ from the CS positive terminal is positive (a potential of the CS positive terminal is higher than that of CS negative terminal). On the other hand, if the input voltage Vsc+ from the input terminal CS− is negative (if a potential of the CS positive terminal is lower than that of the CS negative terminal), the output voltage increases, that is, shows an upward-sloping curve in FIG. 8.

The charging pump 238 includes charge pumping capacitors CP1 and CP2 having a capacitance of, for example, 12 pF. The charging pump 238 inverts a charge pumping direction to a node 240 in accordance with a charge pulse CHG or DSG. That is, in case of charge, charges corresponding to about ⅔ V of an output voltage of the integrator are pumped from the node 240 by alternately using the charge pumping capacitors CP1 and CP2 at the timing when the charge pulse CHG is supplied. On the other hand, in case of discharge, the charge pumping capacitors CP1 and CP2 are charged with a reference voltage VREF to alternately supply charges to the node 240 at the timing when the charge pulse DSG is supplied.

That is, if a positive voltage is input to the CS positive terminal of the integrator (in case of charge), in the V-F converting circuit 224, the comparator 230 compares the output voltage VINT of the integrator with a comparison voltage of 1 V, and the charge pulse CHG is output at a timing when the output voltage reaches 1 V. At this timing, charges of the node 240 are pumped. As a result, the output voltage VINT (node 222) of the integrator is returned to a positive value. Then, the output voltage VINT of the integrator is lowered again.

Meanwhile, if a negative voltage is input to the CS positive terminal of the integrator (in case of discharge), the comparator 228 compares the output voltage VINT of the integrator with a comparison voltage of 2 V, and the charge pulse DSG is output at a timing when the output voltage reaches 2 V. At this timing, charges are supplied to the node 240. The output voltage VINT of the integrator (node 222) is returned to a negative value. Then, the output voltage VINT of the integrator is increased.

In the case of configuring the battery monitoring coulomb counter (current flow meter), a voltage generated across the sensing resistor RS is inverted in accordance with the charging or discharging operation. Thus, in the case of measuring a current flow with a voltage-frequency converter using the integrator, it is necessary to determine whether the charge or discharge is executed as well as convert a frequency. In the V-F converter disclosed by Mader et al., an output voltage of the comparator 228 (charge pulse DSG) is used as a discharging clock representing a discharging operation and an output voltage of the comparator 230 (charge pulse CHG) is used as a charging clock representing a charging operation.

However, according to the method disclosed by Mader et al., it is necessary to pump or supply charges with the capacitor Cp1 or Cp2 of the charging pump 238 each time charge pulses are output from the comparators 228 and 230. The capacitors Cp1 and Cp2 are extra capacitors unlike a capacitor Cint that determines the original integration speed of the V-F converter. This results in a problem in that a chip size of an integrated circuit increases, and a cost increases.

In addition, each time the charge pulses CHG and DSG are output from the comparators 228 and 230, charges should be supplied/pumped to/from the node 240 through the charge/discharge of the capacitor Cp1 or Cp2 of the charging pump 238, which leads to a problem that current consumption increases.

SUMMARY OF THE INVENTION

A voltage-pulse converting circuit according to an aspect of the invention includes: a first input terminal and a second input terminal applied with an input voltage to be converted into a pulse; an integrator having positive and negative input terminals; an input switching unit switching connection between the first and second input terminal and the positive and negative input terminals of the integrator; and a first comparator comparing a first detection voltage with an output voltage of the integrator and a second comparator comparing a second detection voltage different from the first detection voltage with the output voltage, the input switching unit switching the connection based on a comparison result of the first and second comparators.

According to the present invention, the input switching unit switching connection between the first terminal and the second terminal with the positive and negative input terminals of the integrator is provided, whereby the connection can be switched based on a comparison result of the first and second comparators, and a curve of an output voltage of the integrator can be changed in accordance with a charging or discharging operation to generate a pulse in accordance with the charging or discharging operation.

A charge control system according to another aspect of the invention includes: a voltage-pulse converting circuit receiving a potential difference of a resistor connected with a battery charger as an input voltage and converging the input voltage to a pulse; and a charge control unit controlling charging of the battery charger based on a count value of the pulse, the voltage-pulse converting circuit including: an integrator having positive and negative input terminals; an input switching unit switching connection between the first and second input terminal and the positive and negative input terminals of the integrator; and a first comparator comparing a first detection voltage with an output voltage of the integrator and a second comparator comparing a second detection voltage different from the first detection voltage with the output voltage, the input switching unit switching the connection based on a comparison result of the first and second comparators.

According to the present invention, it is possible to provide a voltage-pulse converting circuit capable of downsizing a circuit configuration and saving power consumption, and a charge control system incorporating the same.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments of the present invention are described in detail with reference to the accompanying drawings. In a voltage-pulse converting circuit (V-F converter) of the embodiments, as a voltage polarity of a CS positive terminal is inverted, an output voltage of an integrator is changed in opposite directions (downward-sloping curve and upward-sloping curve). Thus, a charge/discharge flag signal is generated utilizing the fact that one of two comparators connected with an output terminal of the integrator sequentially outputs a signal twice. Then, an input switching circuit capable of switching connection of a voltage-frequency converter with a CS positive terminal and a CS negative terminal as both terminals of a sensing resistor is provided. This input switching circuit is controlled based on the above charge/discharge flag signal to thereby realize a voltage-pulse converting circuit capable of determining whether a voltage of the CS positive terminal is negative or positive.

First Embodiment

Figure 1:
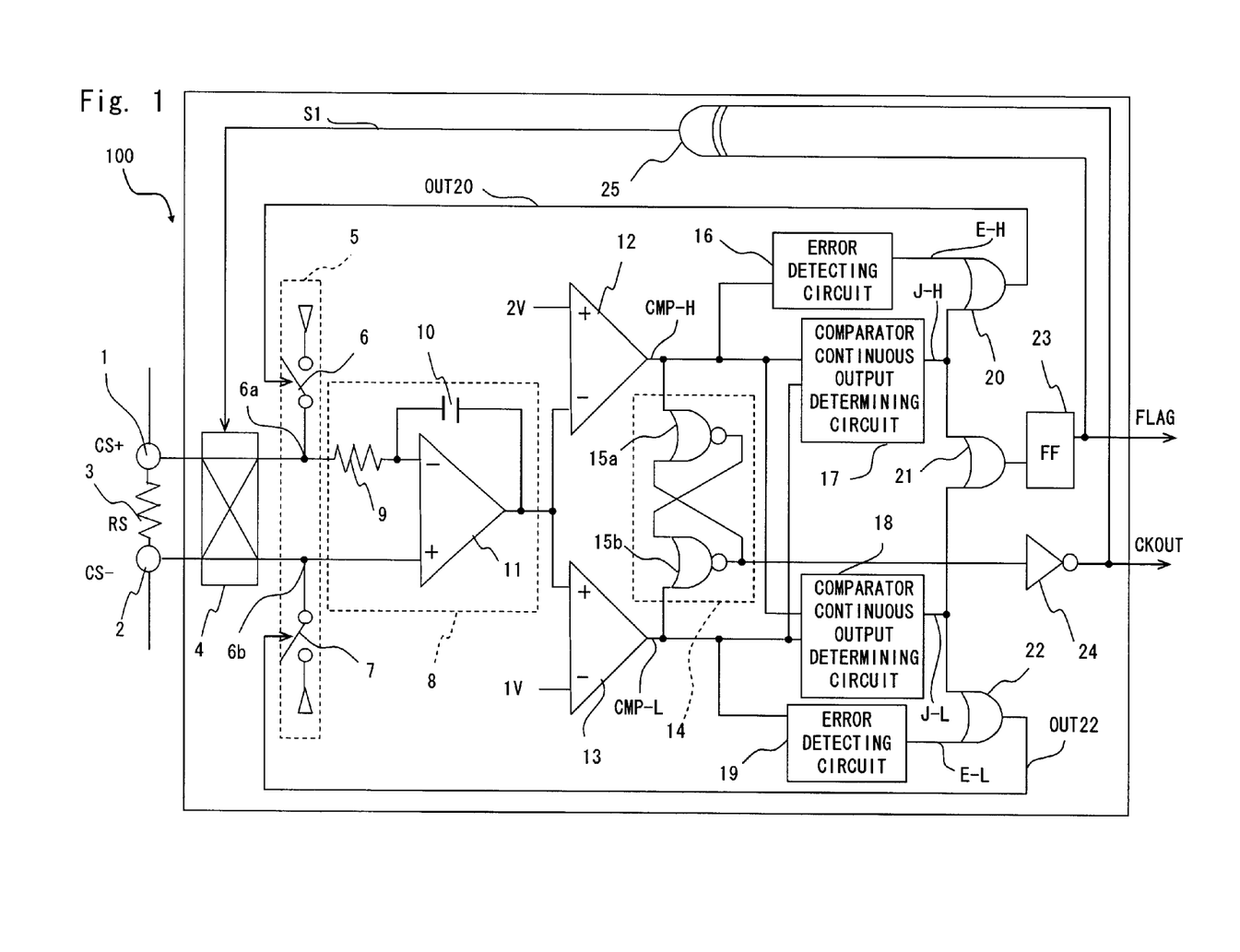
FIG. 1 is a block diagram of a voltage-pulse converting circuit according to a first embodiment of the present invention.
Figure 2:
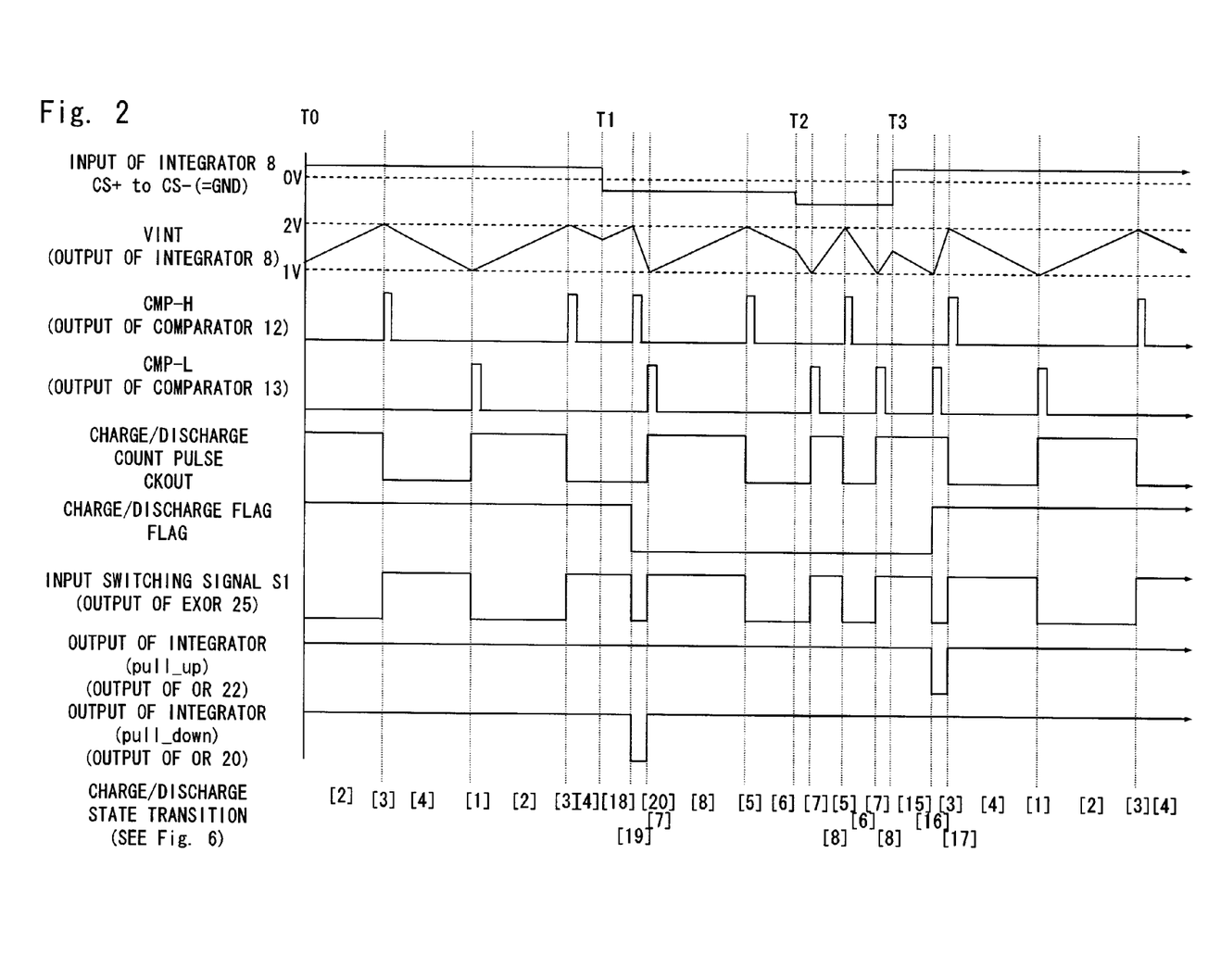
FIG. 2 shows an operational waveform example of the voltage-pulse converting circuit according to the first embodiment of the present invention.
Figure 3:
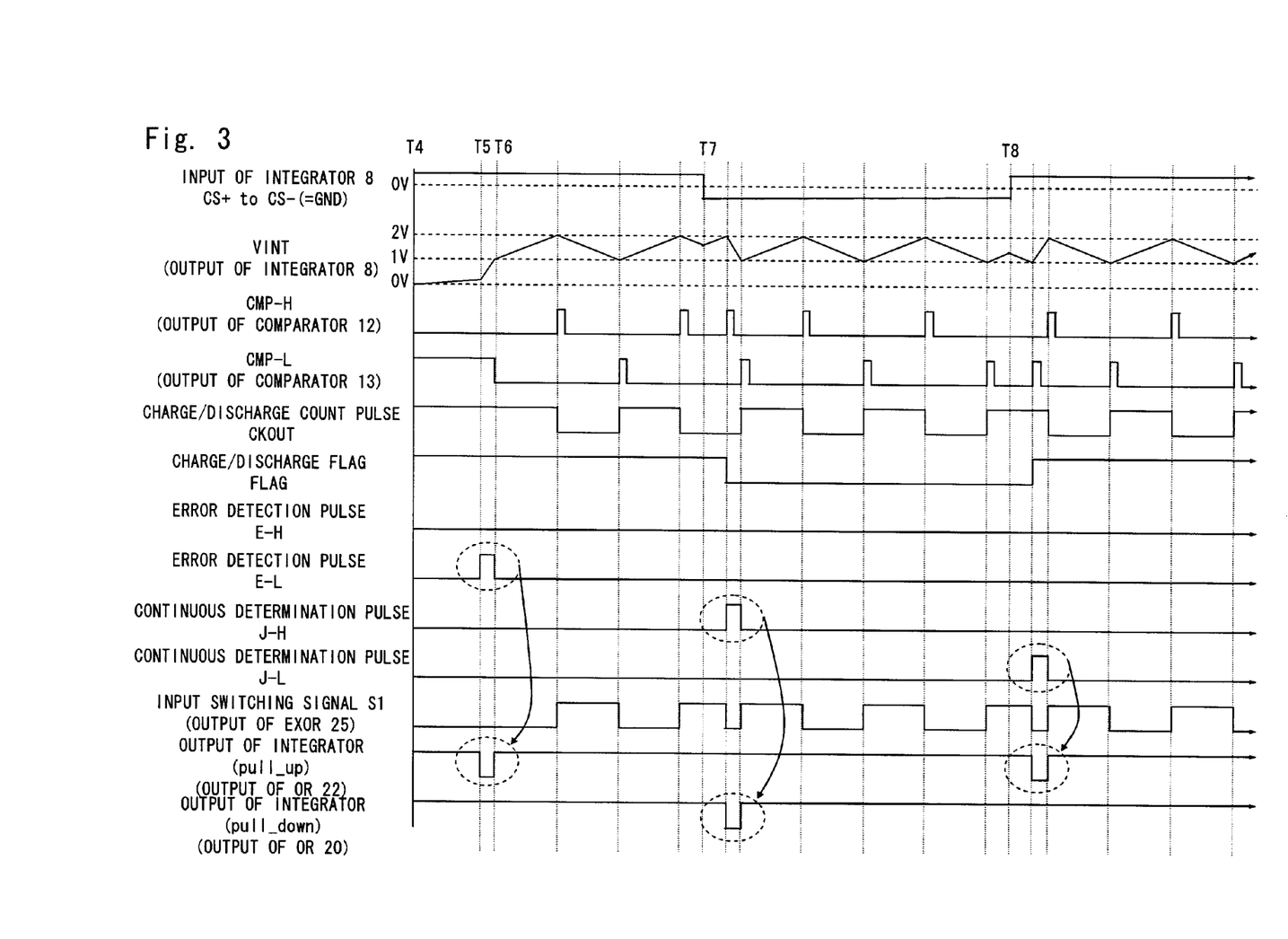
FIG. 3 shows another operational waveform example of the voltage-pulse converting circuit according to the first embodiment of the present invention.
Figure 4:
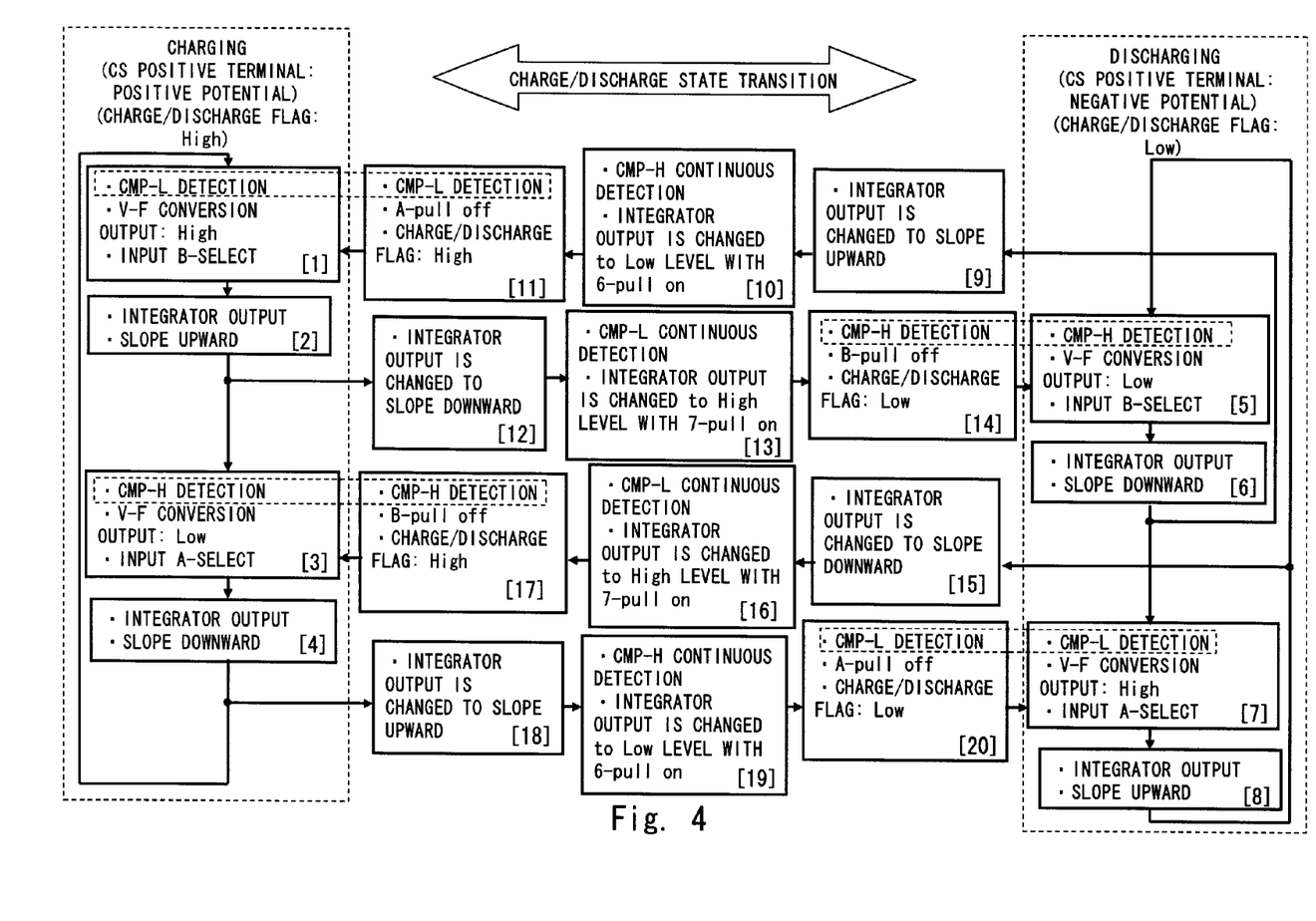
FIG. 4 illustrates the transition to a charge/discharge state of the voltage-pulse converting circuit according to the first embodiment of the present invention.

FIG. 1 is a block diagram of a voltage-pulse converting circuit according to a first embodiment of the present invention, and FIGS. 2 and 3 show an operational waveform example thereof. FIG. 4 illustrates state transition of a voltage-pulse converting circuit 100 of this embodiment.

As shown in FIG. 1, the voltage-pulse converting circuit 100 includes an input switching circuit 4, an integrator output inductive unit 5 as a voltage inductive unit, an integrator 8, first and second comparators 12 and 13 (window comparator), an RS latch circuit 14, first and second integrator output error detecting circuits 16 and 19, first and second comparator continuous output determining circuits 17 and 18, and a flip-flop FF 23 as a flag output unit.

The input switching circuit 4 is connected between one terminal (CS positive terminal) 1 and the other terminal (CS negative terminal) 3 of a current sensing resistor (RS) 3, and two input terminals of an integrator 8. A current sensing resistor 3 has a CS positive terminal 1 connected with, for example, one terminal of a battery charger (not shown). The current sensing resistor 3 is a current detecting resistor detecting a current flowing into a battery charger or flowing out from the battery charger. Further, the current sensing resistor 3 has a CS negative terminal 2 that is generally grounded. Then, a positive terminal of the battery charger is connected with, for example, a positive terminal of a charger (not shown), and a negative terminal of the battery charger is connected with a negative terminal of the charger through the current sensing resistor 3 to thereby charge the battery charger. That is, in case of charge, a charging current flows through the current sensing resistor 3 from the CS positive terminal 1 to the CS negative terminal 2, and a potential of the CS positive terminal 1 becomes higher than that of the CS negative terminal 2, that is, becomes a positive potential with respect to the CS negative terminal 2. On the other hand, in case of discharge, a current flows in a direction opposite to that of the charging operation, namely, in a direction from the CS negative terminal 2 to the CS positive terminal 1 of the current sensing resistor 3, and a potential of the CS positive terminal 1 becomes lower than that of the CS negative terminal 2, that is, becomes a negative potential with respect to the CS negative terminal 2.

The voltage-pulse converting circuit 100 detects a current flowing through the current sensing resistor 3 upon charging or discharging and receives a voltage across the sensing resistor RS to convert the input voltage into a pulse and output the pulse from a clock output CKOUT. Further, a flag representing a charging or discharging operation is output from a flag output FLAG.

The input switching circuit 4 connects a positive or negative input of the integrator 8 with the CS positive terminal 1, and connects a positive or negative input of the integrator 8 to the CS negative terminal 2 in accordance with a switching control signal S1. The switching control signal S1 is generated in accordance with the output clock CKOUT obtained by converting a voltage into a frequency and the flag FLAG representing a charging or discharging operation. In this example, if the switching control signal S1 is at HIGH, the CS positive terminal 1 is connected with the negative terminal of the integrator 8 through the resistor 9, and the CS negative terminal 2 is connected with the positive terminal of the integrator 8. Hereinafter, this connection state is called "A-select". If the switching control signal S1 is at LOW, the CS negative terminal 2 is connected with the negative terminal of the integrator 8 through the resistor 9, and the CS positive terminal 1 is connected with the positive terminal of the integrator 8. Hereinafter, this connection state is called "B-select".

The integrator 8 includes a differential amplifier 11, the resistor 9 having one end connected with a negative terminal (inverted input terminal) of the differential amplifier 11, and a capacitor 10 connected between an output of the differential amplifier 11 and a negative terminal thereof. The other end of the resistor 9 and a positive terminal (non-inverted input terminal) of the differential amplifier 11 are connected with the CS positive terminal 1 or CS negative terminal 2 by the input switching circuit 4.

The first comparator 12 has a positive terminal set to a second detection potential of, for example, 2 V and has a negative terminal connected with the output of the integrator 8. The first comparator 12 outputs a detection signal (CMP-H) that is switched to HIGH when an output voltage of the integrator 8 is higher than the detection potential (2 V). The second comparator 13 has a negative terminal set to a first detection potential of, for example, 1 V, and has a positive terminal connected with the output of the integrator 8. The second comparator 13 outputs a detection signal (CMP-L) that is switched to HIGH when the output voltage of the integrator 8 is lower than the detection potential (1 V).

The RS latch circuit 14 includes two NOR circuits 15a and 15b. One input terminal of the NOR circuit 15a is connected with the output of the first comparator 12, and the other input terminal is connected with an output of the NOR circuit 15b. One input terminal of the NOR circuit 15b is connected with the output of the NOR circuit 15a, and the other input terminal is connected with the output of the second comparator 13. Therefore, the RS latch circuit 14 outputs a LOW level if the first comparator 12 outputs the detection signal (CMP-H) and outputs a HIGH level if the second comparator 13 outputs the detection signal (CMP-L).

An output voltage of the first comparator 12 is also supplied to the first integrator output error detecting circuit 16, and the first and second comparator continuous output determining circuits 17 and 18. An output voltage of the second comparator 13 is also supplied to the second integrator output error detecting circuit 19, and the first and second comparator continuous output determining circuits 17 and 18.

An output voltage of the first integrator output error detecting circuit 16 is generally at LOW level. If an output voltage of the integrator 8 is equal to or higher than the detection voltage (2 V) for a predetermined period, an error detection pulse E-H is output. An output voltage of the second integrator error detecting circuit 19 is generally at LOW level, but if the output voltage of the integrator 8 is equal to or lower than the detection voltage (1 V) for a predetermined period, an error detection pulse E-L is output.

As described above, the first comparator continuous output determining circuit 17 receives the output pulse CMP-H from the first comparator 12 and the output pulse CMP-L from the second comparator 13. The first comparator continuous output determining circuit 17 outputs a LOW level if the pulses CMP-H and CMP-L are alternately supplied. On the other hand, the first comparator continuous output determining circuit 17 outputs a continuous determination pulse J-H if the output pulse CMP-H is continuously supplied from the first comparator 12 twice.

Likewise, the second comparator continuous output determining circuit 18 is also supplied with the output pulse CMP-H from the first comparator 12 and the output pulse CMP-L from the second comparator 13 as described above. The second comparator continuous output determining circuit 18 outputs a LOW level if the pulses CMP-H and CMP-L are alternately supplied. On the other hand, second comparator continuous output determining circuit 18 outputs a continuous determination pulse J-L if the output pulse CMP-L is sequentially supplied from the second comparator 12 twice.

Further, the voltage-pulse converting circuit 100 of this embodiment includes an OR circuit 20 receiving an output pulse of the first integrator output error detecting circuit 16 (error detection pulse E-H) and an output pulse of the first comparator continuous output determining circuit 17 (continuous determination pulse J-H). An output voltage of the OR circuit 20 is supplied to one input terminal of the integrator output inductive unit 5. Further, the circuit includes an OR circuit 22 receiving an output pulse of the second integrator output error detecting circuit 19 (error detection pulse E-L) and an output pulse of the second comparator continuous output determining circuit 18 (continuous determination pulse J-L). An output voltage of the OR circuit 22 is supplied to the other input terminal of the integrator output inductive unit 5.

The integrator output inductive unit 5 includes a switch 6 having one end connected with a node 6a between the input switching circuit 4 and the resistor 9 of the integrator 8 and having the other end set to a reference potential Vref1. The integrator output inductive unit 5 turns ON/OFF the switch 6 based on an output voltage OUT20 of the OR circuit 20 to lead the output voltage of the integrator 8 to around the detection potential of the second comparator. Further, integrator output inductive unit 5 includes a switch 7 having one end connected with a node 7a between the input switching circuit 4 and the positive terminal of the differential amplifier 11 of the integrator 8 and having the other end set to the reference potential Vref2. Then, the integrator output inductive unit 5 turns ON/OFF the switch 7 based on an output voltage OUT22 of the OR circuit 22 to lead the output voltage of the integrator 8 to around the detection potential of the first comparator. A required potential difference of the current sensing resistor 3 is, for example, 50 mV or higher, and the reference potentials Vref1 and Vref2 may be, for example, 2.5 V.

Further, the voltage-pulse converting circuit 100 includes an OR circuit 21 receiving output pulses of the first and second comparator continuous output determining circuits 17 and 18 and inputting the received pulses to the FF 23. An output signal of the FF 23 is sent out as the charge/discharge flag FLAG and supplied to an EXOR circuit 25.

Further, the voltage-pulse converting circuit 100 includes an inverter circuit (NOT circuit) 24 inverting an output signal of an RS latch circuit 14. An output signal of the inverter circuit 24 is sent out as the charge/discharge count pulse CKOUT and supplied to the EXOR circuit 25.

The EXOR circuit 25 supplies the input switching signal S1 to the input switching circuit 4. The input switching signal S1 is exclusive OR of the charge/discharge flag FLAG and the charge/discharge count pulse CKOUT. As described above, the input switching circuit 4 switches the connection between the CS positive terminal 1, the CS negative terminal 2, and the nodes 6a and 7a in accordance with the input switching signal S1 under control.

As for the operation of the voltage-pulse converting circuit 100, an input switching circuit 4 is connected between the CS positive terminal 1, CS negative terminal 2, and the input terminals of the integrator 8. Therefore, even if a voltage of the CS positive terminal 1 is higher (or lower) than that of the CS negative terminal 2, the CS positive terminal 1, CS negative terminal 2, and two input terminals of the integrator 8 can be switchingly connected by the input switching circuit 4. Thus, the output voltage of the integrator 8 can be changed to increase or decrease.

Therefore, if only voltage-frequency conversion is required, after one of the comparator 12 and comparator 13 outputs the detection signal CMP-H or CMP-L, the input terminals of the input switching circuit 4 are switched to change the output voltage of the integrator 8 in opposite directions. After a while, the remaining comparator outputs a pulse, and then the connection of the input terminals of the input switching circuit 4 may be returned to the original connection form, and the output voltage curve of the integrator 8 may be changed to the original curve under control. In this way, the voltage-pulse converting circuit 100 can switch the connection between the input terminals of the integrator 8, the CS positive terminal 1, and the CS negative terminal 2 by providing the input switching circuit 4. Hence, the voltage-pulse converting circuit 100 does not require a charging pump unlike the conventional technique, and can simplify the circuit configuration.

However, it is uncertain whether the voltage of the CS positive terminal 1 is higher or lower than the voltage of the CS negative terminal 2 only through the above operation. TO that end, the voltage-pulse converting circuit 100 of this embodiment generates a flag signal (charge/discharge flag FLAG) that represents whether the voltage of the CS positive terminal 1 is higher or lower than that of the CS negative terminal 2. As a result, it is possible to determine whether or not the voltage of the CS positive terminal 1 is higher or lower, that is, charge or discharge is executed.

Next, operations of the voltage-pulse converting circuit 100 of this embodiment are described in detail with reference to FIGS. 2 to 4. In FIG. 2, [1] to [20] that indicate the transition of charge/discharge states corresponds to [1] to [20] that indicate the state transition of FIG. 4.

First, during a period from time T0 to T1 of FIG. 2, a charge FLAG is HIGH, which represents a charging operation. In this case, the output voltage of the integrator 8 reaches the detection voltage of one of the comparators 12 and 13 to output the detection signal. At the same time, a switching signal S1 of the input switching circuit 4 is inverted. As a result, the input of the integrator 8 is inverted, and the curve of the output voltage VINT is changed in opposite direction. Thus, the output pulses of the comparators 12 and 13 are alternately output, and at the same time, the output voltage curve of the integrator 8 repeatedly slopes upward and downward.

To be specific, in this example, the state is shifted in the order of [2]→[3]→[4]→[1]→[2]→ . . . of FIG. 4. First, an output voltage of the integrator 8 increases [2] to reach 2 V, and then the first comparator 12 outputs the detection signal CMP-H [3]. At this time, the charge/discharge count pulse CKOUT as an output pulse of the voltage-pulse converting circuit 100 is shifted to LOW, and the input switching signal S1 is shifted to HIGH. The input switching circuit 4 connects the CS positive terminal 1 with the node 6a and connects the CS negative terminal 2 with the node 7a (A-select). Thus, the curve of the output voltage VINT of the integrator slopes downward [4] to reach 1 V, and then the second comparator 13 outputs the detection signal CMP-L [1]. At this time, the charge/discharge count pulse CKOUT as an output pulse of the voltage-pulse converting circuit 100 is shifted to HIGH, and the input switching signal S1 is shifted to LOW. The input switching circuit 4 connects the CS negative terminal 2 with the node 6a, and connects the CS positive terminal 1 with the node 7a (B-select). During the charging operation, the above operations are repeated.

At a timing T1, the voltage of the CS positive terminal 1 is changed from a positive voltage to a negative voltage. That is, the state is changed from the charge state to the discharge state. Thus, the output voltage curve of the integrator 8 slopes in a direction opposite to that in the period from T0 to T1. One of the comparators 12 and 13 that have alternately output signals outputs sequentially a detection signal twice. The comparator continuous output determining circuits 17 and 18 detects that the comparator sequentially outputs the signal twice. The integrator output inductive unit 5 determines that a voltage polarity of the CS positive terminal 1 and the curve of the output voltage VINT of the integrator 8 are changed, and the output voltage VINT of the integrator 8 is led to around the detection voltage of the other comparator. At the same time, the charge/discharge flag FLAG is inverted, and a phase of the switching signal of the input switching circuit 4 is inverted. As a result of transition of charge/discharge states, even during a period from T1 to T3 where the voltage of the CS positive terminal 1 is negative, the comparators 12 and 13 can alternately output signals as in the period from T0 to T1. Further, when the voltage polarity of the CS positive terminal 1 is changed, the charge/discharge flag FLAG is shifted from HIGH to LOW, making it possible to determine the voltage polarity of the CS positive terminal 1.

To be specific, in this example, the output voltage curve of the integrator 8 is changed to slope upward from downward, from time T1 onward [18]. As a result, the first comparator 12 detects 2 V again to output the detection signal CMP-H [19]. At the same time, the first comparator continuous output determining circuit 17 detects that the first comparator 12 sequentially outputs the detection signal CMP-H twice to determine that the voltage polarity of the CS positive terminal 1 and the curve of the output voltage VINT of the integrator 8 are changed. Then, the output OUT20 of the OR circuit 20 is shifted to LOW to turn ON the switch 6 of the integrator output inductive unit 5 (pull on). Hence, charges are accumulated in the capacitor 10, and the output voltage of the differential amplifier 11 is lowered. In this way, the output voltage VINT of the integrator 8 is led to around the detection voltage (1 V) of the second comparator. At the same time, the charge/discharge flag FLAG is inverted to LOW level to thereby represent the charge state. Incidentally, since the charge/discharge flag FLAG is LOW, an output signal of the EXOR circuit 25 is inverted, and a phase of the input switching signal S1 of the input switching circuit 4 is inverted. During such a period that the output OUT20 of the OR circuit 20 is LOW, the input switching signal S1 is not supplied to the input switching circuit 4 through masking.

Next, the output voltage of the integrator 8 reaches the detection voltage (V1) of the second comparator 13, and then the detection signal CMP-L is output. After that, the charge/discharge count pulse CKOUT is shifted to HIGH, the output OUT20 of the OR circuit 20 is returned to HIGH, and the switch 6 of the integrator output inductive unit 5 is turned OFF. If the output OUT20 of the OR circuit 20 is shifted to HIGH, the input voltage of the switching control signal S1 of the EXOR circuit 25 is supplied to the input switching circuit 4 again. The input switching signal S1 is shifted to HIGH again in accordance with the charge/discharge count pulse CKOUT, and the connection state becomes "A-select" (pull off) [20] ([7]).

Further, during a period from T2 to T3 of FIG. 2, a voltage of the CS positive terminal 1 is negative at time T2, but the voltage is changed to change the output voltage curve of the integrator 8. If the voltage at the CS positive terminal 1 is further lowered, the curve of the output voltage VINT of the integrator 8 becomes sharp, with the result that a period of the charge/discharge count pulse CKOUT is shortened.

In the period from T1 to T3, FLAG is LOW, and the discharging operation is represented. Then, the state transition is repeated in the order of [8]→[5]→[6]→[7]→[8]→ . . . of FIG. 4. That is, when the output voltage VINT of the integrator 8 that slopes upward [8] reaches the detection voltage of the first comparator 12 (2 V), a detection signal CMP-H is output from the first comparator 12 [5]. At this time, the charge/discharge count pulse CKOUT output from the voltage-pulse converting circuit 100 is shifted to LOW, and the input switching signal S1 is shifted to LOW. As a result, the input switching circuit 4 changes the connection state to "B-select". The output voltage VINT of the integrator 8 slopes downward [6] to reach 1 V, and at this point, the second comparator 13 outputs the detection signal CMP-L [7]. At this time, the charge/discharge count pulse CKOUT output from the voltage-pulse converting circuit 100 is shifted to HIGH, and the input switching signal S1 is shifted to HIGH. As a result, the input switching circuit 4 changes the connection state to "A-select". In case of discharge, the above operation is repeated.

At time T3 of FIG. 2, the voltage of the CS positive terminal 1 is changed from a negative voltage to a positive voltage to restart charging. First, the second comparator 13 sequentially outputs the detection signal CMP-L twice. In this case as well, basically, the output voltage VINT of the integrator 8 first comparator 12 is led up to around the detection voltage and at the same time, the charge/discharge flag FLAG is inverted as described above.

To be specific, in this example, the output voltage of the integrator 8 that slopes upward [8] is changed to slope downward from time T3 onward [15]. As a result, the second comparator 13 detects 1 V to sequentially output the detection signal CMP-L [16]. At the same time, the second comparator continuous output determining circuit 18 detects that the second comparator 12 sequentially outputs the detection signal CMP-L twice and determines that a polarity of the voltage of the CS positive terminal 1 and the curve of the output voltage VINT of the integrator 8 are changed. Then, the output OUT22 of the OR circuit 22 is shifted to LOW, and the switch 7 of the integrator output inductive unit 5 is turned ON (pull on). Thus, the positive terminal of the integrator 8 becomes higher than the negative terminal, and an output voltage of the differential amplifier 11 increases. In this way, the output voltage VINT of the integrator 8 is led to around the detection voltage (2 V) of the first comparator. Further, at the same time, the charge/discharge flag FLAG is inverted to HIGH. Incidentally, an output voltage of the EXOR circuit 25 is inverted and a phase of the switching signal S1 of the input switching circuit 4 is inverted. The switching signal S1 is masked during a period where the output OUT22 of the OR circuit 22 is LOW. That is, the input switching circuit 4 keeps the connection state at "A-select".

Next, if the output voltage VINT of the integrator 8 reaches the detection voltage (V2) of the first comparator 12, the detection signal CMP-H is output, and the charge/discharge count pulse CKOUT is shifted to LOW. Then, the output OUT22 of the OR circuit 22 becomes HIGH, and the switch 7 of the integrator output inductive unit 5 is turned OFF. Then, the input switching signal S1 output from the EXOR circuit 25 is supplied to the input switching circuit 4 (pull off) [17] ([7]).

In this example, if the output voltage VINT of the integrator 8 is equal to or higher than the detection voltage of the first comparator 12 over a predetermined period or more, the integrator output error detecting circuit 16 determines such situation abnormal. The integrator output error detecting circuit 16 leads the output voltage VINT of the integrator 8 to around the detection voltage of the second comparator 13 to enable normal operations. Likewise, if the output voltage of the integrator 8 is equal to or lower than the detection voltage of the comparator 13 over a predetermined period or more, the integrator output error detecting circuit 19 determines such situation abnormal. The integrator output error detecting circuit 19 leads the output voltage of the integrator 8 to around the detection voltage of the comparator 12 to enable normal operations. Such errors may occur, for example, upon power-on or if noise components are superimposed on an output signal of the integrator 11. FIG. 3 shows an example where the integrator output error detecting circuit 19 detects an abnormality to output the error detection pulse E-L.

During a period from T4 to T7 of FIG. 3, a charging operation is executed under such conditions that a potential of the CS positive terminal 1 is positive, and the charge/discharge flag FLAG is HIGH. In this example, at time T5, the integrator output error detecting circuit 19 outputs the error detection pulse E-L and at the same time, an output voltage of the OR circuit 22 is HIGH, and the switch 7 of the integrator output inductive unit 5 is turned ON. As a result, the integrator output inductive unit 5 leads an output voltage of the integrator 8 to around the detection voltage of the second comparator 13. Then, if the output voltage VINT of the integrator 8 exceeds the detection voltage (1 V) of the second comparator 13, the comparator stops outputting the detection signal CMP-L. Thus, an output voltage of the integrator output error detecting circuit 19 is LOW, and at the same time, the output OUT22 of the OR circuit 22 also becomes LOW to turn OFF the switch 7. From then on, similar operations to the above charging operation or discharging operation are repeated.

Further, from T7 onward, the operation is shifted from charging to discharging, and the discharging operation is continued until time T8. Then, from T8 forward, the operation is shifted from discharging to charging, and the charging operation is repeated. The charging or discharging operation or the way to shift the operation to the charging/discharging operation are the same as above.

In this embodiment, a capacitance like the capacitances Cp1 and Cp2 of the interleaved charging pump required in the related art is not necessary, so a large area is not required for composing the voltage-pulse converting circuit with a semiconductor integrated circuit, and wasteful charging/discharging operations of the capacitor can be curtailed to save power consumption.

Second Embodiment

Figure 5:
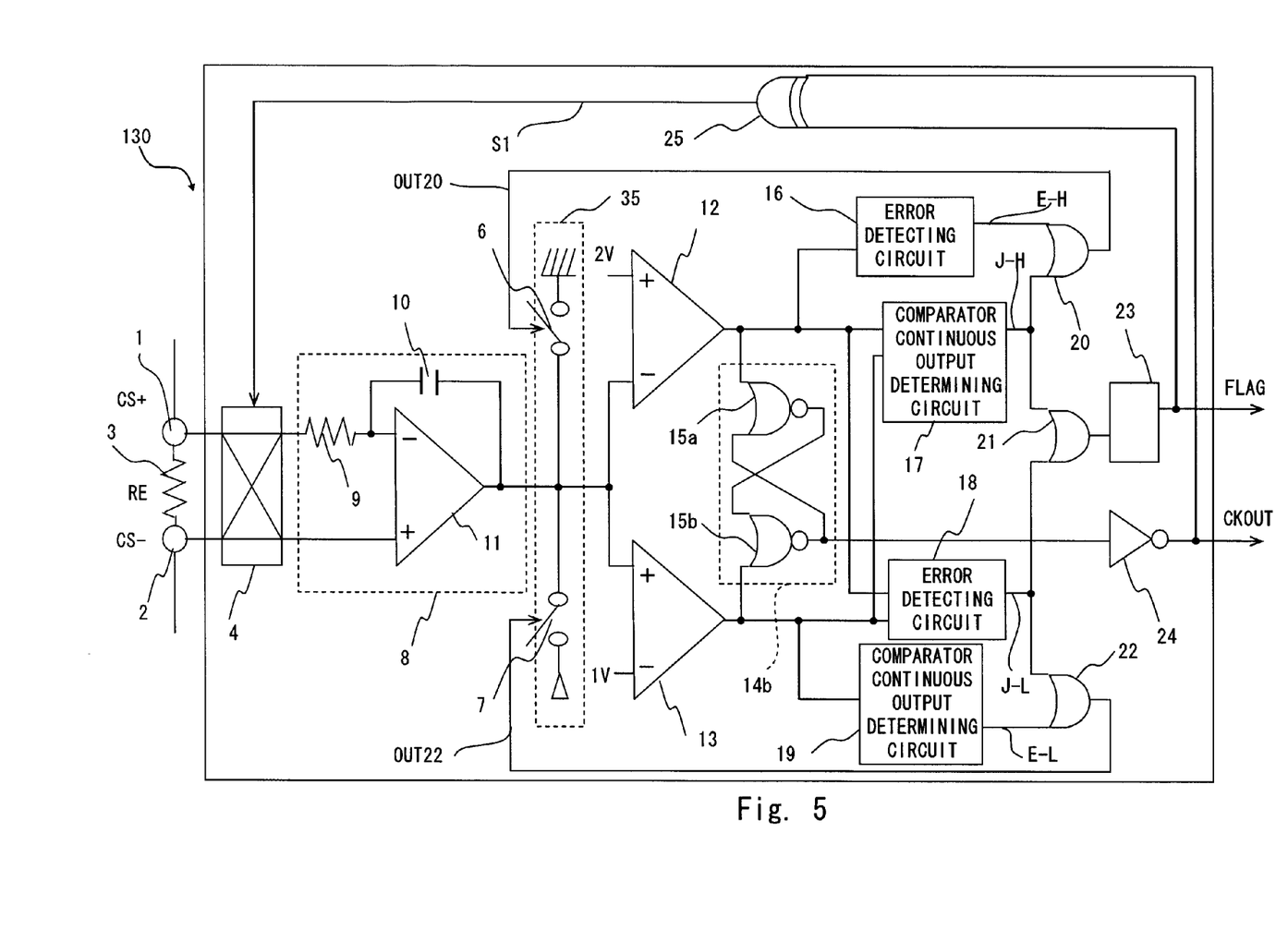
FIG. 5 is a block diagram of a voltage-pulse converting circuit according to a second embodiment of the present invention.

Next, a voltage-pulse converting circuit according to a second embodiment of the present invention is described. FIG. 5 is a block diagram of the voltage-pulse converting circuit of this embodiment. Incidentally, in this embodiment as shown in FIG. 5, the same components as those of the first embodiment as shown in FIG. 1 are denoted by like reference numerals, and detailed description thereof is omitted.

As shown in FIG. 5, a voltage-pulse converting circuit 130 of this embodiment differs from the first embodiment in terms of a connection position of the output inductive unit of the integrator. That is, in the first embodiment, the integrator output inductive unit 5 is connected between the input switching circuit 4 and two input terminals of the integrator 8. In this embodiment, the unit is directly connected with an output terminal of the integrator 8.

In an integrator output inductive unit 35, a switch 36 turned ON/OFF based on the output OUT20 of the OR circuit 20 and a switch 37 turned ON/OFF based on the output OUT22 of the OR circuit 22 are connected in series. A node between the switch 36 and the switch 37 is connected with an output terminal of the integrator 8. The other end of the switch 6 is grounded, and the other end of the switch 37 is connected with a reference potential Vref3. The reference potential Vref3 is, for example, a power supply potential VDD.

In the thus-configured voltage-pulse converting circuit 130 of this embodiment as well, similar operations to the above voltage-pulse converting circuit 100 can be realized.

In this embodiment, beneficial effects similar to those of the above first embodiment can be attained. That is, an output pulse obtained through V-F conversion (charge/discharge count pulse CKOUT) and a polarity of the input terminal CS positive terminal (charge/discharge flag FLAG) can be attained with a logic circuit except the integrator 8 and the comparators 12 and 13. Hence, a capacitance of a charging pump necessary in the related art is unnecessary, and a voltage-pulse converting circuit capable of reducing wasteful power consumption with a small area can be realized.

Further, in this embodiment, an output terminal of the integrator 8 is connected with the integrator output inductive unit 5, so a speed for switching the charging/discharging operations is increased as compared with the first embodiment.

Other Embodiments

Figure 6:
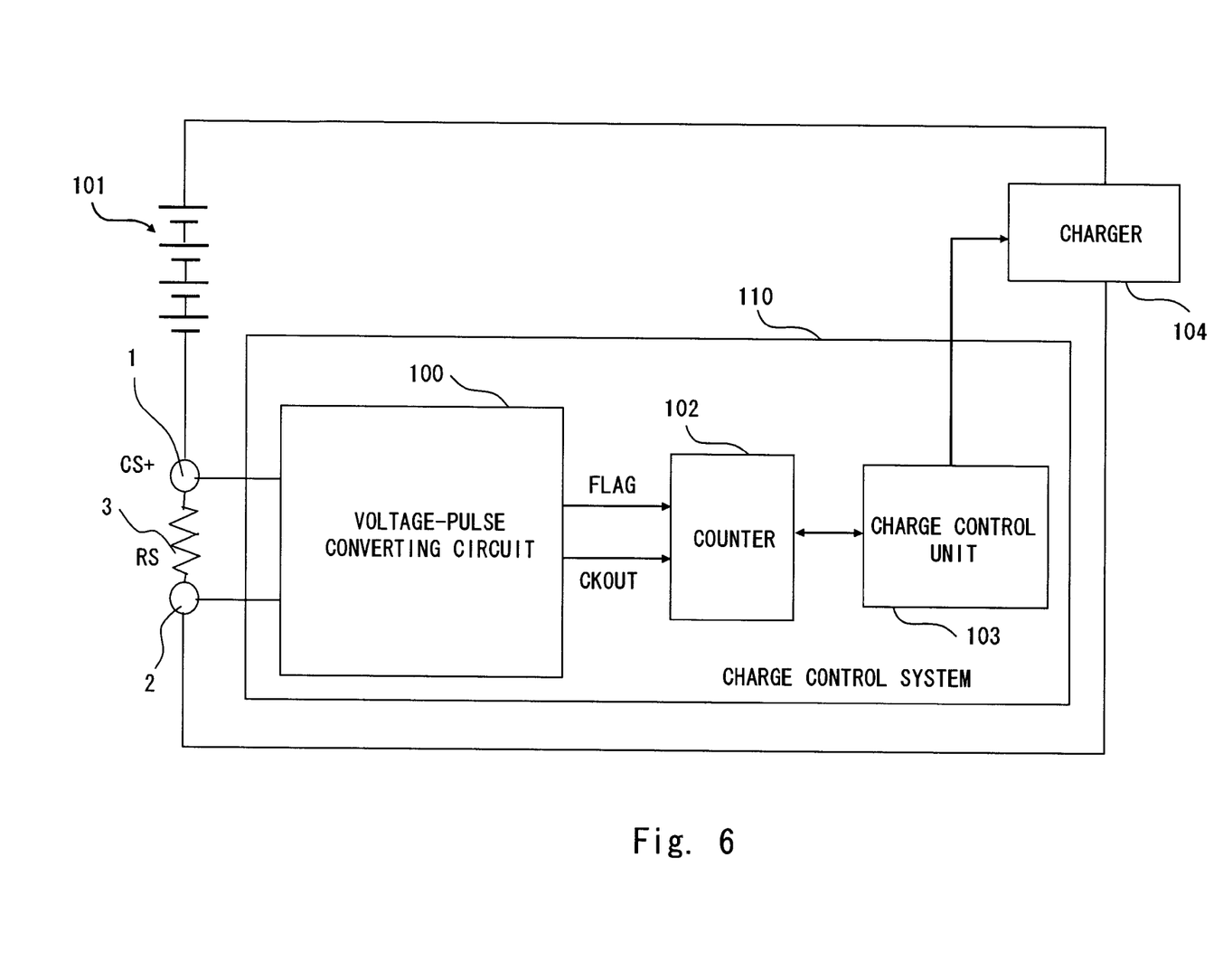
FIG. 6 shows a charge control system according to another embodiment of the present invention.

FIG. 6 shows a charge control system according to another embodiment of the present invention. This embodiment is accomplished by applying the voltage-pulse converting circuit of the above the first and second embodiments to a charge control system controlling charging/discharging operations of the battery charger.

As shown in FIG. 6, the CS positive terminal 1 of the current sensing resistor 3 is connected with a negative terminal of the battery charger 101 series-connected with the secondary battery. The battery charger 101 is charged by the charger 104 through the positive terminal and the CS negative terminal of the battery charger 101. The charge control system 110 includes the above voltage-pulse converting circuit 100, the counter 102, and the charge control unit 102 connected with the CS positive terminal 1 and the CS negative terminal 2 of the sensing resistor 3. The counter 102 is supplied with the charge/discharge flag FLAG and the charge/discharge count pulse CKOUT from the voltage-pulse converting circuit 100 to count the number of charge/discharge count pulses CKOUT. The counter 102 may be a counter counting the number of pulses in accordance with whether the charge/discharge flag FLAG is High or Low, or may be a counter incrementing or decrementing the count value in accordance with whether the flag is High or Low. Incidentally, the counter 102 may be, of course, provided in the voltage-pulse converting circuit 100.

Based on the count value of the counter 102, the charge control unit 103 calculates a current battery power of the battery charger 101 to control charging/discharging operations of the charger 104. Further, in the case where the battery charger 101 is full-charged, the count value of the counter 102 is reset. The charge control unit 103 can calculate how much (coulomb) the charging or discharging is carried out per charge/discharge count pulse CKOUT. Based on the calculation result, the charge control unit executes control and management to cause the charger 104 to start or stop charging or the battery charger 101. Further, in the case of performing a processing of protecting a battery from overcharge/overdischarge or not performing such processing, a mode may be shifted to low-power-consumption mode.

In this embodiment, it is possible to provide a charge control system that incorporates a voltage-pulse converting circuit that does not require a capacitance of a charging pump that is necessary in the related art and can save wasteful power consumption with a small area, and thus can reduce an area and power and power consumption.

It is apparent that the present invention is not limited to the above embodiment that may be modified and changed without departing from the scope and spirit of the invention.

What is claimed is:

1. A voltage-pulse converting circuit, comprising: a first input terminal and a second input terminal applied with an input voltage to be converted into a pulse;
an integrator having positive and negative input terminals selectively connected to said first and second input terminals;
an input switching unit switching a connection from the first input terminal to the positive input terminal and from the second input terminal to the negative input terminal, to a connection from the first input terminal to the negative input terminal and from the second terminal to the positive input terminal; and
a first comparator comparing a first detection voltage with an output voltage of the integrator and a second comparator
comparing a second detection voltage different from the first detection voltage with the output voltage,
wherein the input switching unit switching the connection based on a comparison result of the first and second comparators such that switching occurs when an output voltage of the integrator reaches the first or second detection voltages.

2. The voltage-pulse converting circuit according to claim 1, further comprising a voltage inductive unit changing an output voltage of the integrator to around the first or second detection voltage.

3. The voltage-pulse converting circuit according to claim 1, wherein when one of the first and second comparators detects a detection voltage, the input switching circuit switches connection between the first terminal and the second terminal, and the positive and negative input terminals of the integrator.

4. The voltage-pulse converting circuit according to claim 1, wherein when one of the first and second comparators sequentially detects a detection voltage, the voltage inductive unit changes the output voltage of the integrator to around a detection voltage of the other comparator.

5. The voltage-pulse converting circuit according to claim 2, wherein when one of the first and second comparators sequentially detects a detection voltage, the voltage inductive unit changes the output voltage of the integrator to around a detection voltage of the other comparator.

6. The voltage-pulse converting circuit according to claim 2, wherein the voltage inductive unit is provided between the input switching unit and the integrator, wherein the voltage inductive unit is provided between the input switching unit and the integrator.

7. The voltage-pulse converting circuit according to claim 3,
wherein the voltage inductive unit is provided between the input switching unit and the integrator.

8. The voltage-pulse converting circuit according to claim 2,
wherein the voltage inductive unit is connected with an output terminal of the integrator.

9. The voltage-pulse converting circuit according to claim 3,
wherein the voltage inductive unit is connected with an output terminal of the integrator.

10. The voltage-pulse converting circuit according to claim 1, further comprising:
an flag output unit outputting a charge/discharge flag representing whether or not a potential of the first terminal is higher than a potential of the second terminal based on a comparison result of the first and second comparators; and
a clock output unit outputting an output signal having a frequency corresponding to a potential difference between the first and second terminals based on the comparison result of the first and second comparators.

11. The voltage-pulse converting circuit according to claim 2, further comprising:
an flag output unit outputting a charge/discharge flag representing whether or not a potential of the first terminal is higher than a potential of the second terminal based on a comparison result of the first and second comparators; and
a clock output unit outputting an output signal having a frequency corresponding to a potential difference between the first and second terminals based on the comparison result of the first and second comparators.

12. The voltage-pulse converting circuit according to claim 1, further comprising:
an flag output unit outputting a charge/discharge flag representing whether or not a potential of the first terminal is higher than a potential of the second terminal based on a comparison result of the first and second comparators; and
a clock output unit outputting an output signal having a frequency corresponding to a potential difference between the first and second terminals based on the comparison result of the first and second comparators,
wherein the input switching circuit switching connection between the first terminal and the second terminal, and the positive and negative input terminals of the integrator based on the charge/discharge flag and the output signal.

13. The voltage-pulse converting circuit according to claim 2, further comprising:
an flag output unit outputting a charge/discharge flag representing whether or not a potential of the first terminal is higher than a potential of the second terminal based on a comparison result of the first and second comparators; and
a clock output unit outputting an output signal having a frequency corresponding to a potential difference between the first and second terminals based on the comparison result of the first and second comparators,
wherein the input switching circuit switching connection between the first terminal and the second terminal, and the positive and negative input terminals of the integrator based on the charge/discharge flag and the output signal.

14. The voltage-pulse converting circuit according to claim 2, further comprising;
first and second continuous output determining circuits outputting first and second continuous detection signals based on a comparison result of the first and second comparators,
wherein the voltage inductive unit including a first switch set to a first potential and a second switch set to a second potential, and
the first and second switches being connected with the negative and positive input terminals of the integrator and turned ON/OFF under control based on the first and second continuous detection signals.

15. The voltage-pulse converting circuit according to claim 2, further comprising;
   first and second continuous output determining circuits outputting first and second continuous detection signals based on a comparison result of the first and second comparators,
   wherein the voltage inductive unit including a third switch set to a potential lower than the first potential and a fourth switch set to a potential lower than a second potential, and
   the third and fourth switches being connected with an output terminal of the integrator and turned ON/OFF under control based on the first and second continuous detection signals.

16. The voltage-pulse converting circuit according to claim 1, further comprising:
   an error detecting circuit generating an integrator output error signal if the output voltage of the integrator is higher
   than the second detection voltage over a predetermined period or more; and
   a voltage inductive unit changing the output voltage of the integrator to a potential lower than the second detection voltage based on the integrator output voltage error signal.

17. The voltage-pulse converting circuit according to claim 1, further comprising:
   an error detecting circuit generating an integrator output error signal if the output voltage of the integrator is lower than 5 the second detection voltage over a predetermined period or more; and
   a voltage inductive unit changing the output voltage of the integrator to a potential higher than the second detection voltage based on the integrator output voltage error signal.

18. A charge control system, comprising:
   a voltage-pulse converting circuit receiving a potential difference of a resistor connected with a battery charger as an input voltage across a first and second input terminal and converging the input voltage to a pulse; and
   a charge control unit controlling charging of the battery charger based on a count value of the pulse,
   the voltage-pulse converting circuit including:
   an integrator having positive and negative input terminals selectively connected to said first and second input terminals;
   an input switching unit switching a connection from the first input terminal to the positive input terminal of the integrator and from the second input terminal to the negative input terminal, to a connection from the first input terminal to the negative input terminal and from the second terminal to the positive input terminal; and
   a first comparator comparing a first detection voltage with an output voltage of the integrator and a second comparator comparing a second detection voltage different from the first detection voltage with the output voltage,
   wherein the input switching unit switching the connection based on a comparison result of the first and second comparators such that switching occur when an output voltage of the integrator reaches the first or second detection voltages.

19. The charge control system according to claim 18, further comprising a counter counting the number of pulses output from the voltage-pulse converting circuit,
   the charge control unit controlling the charging based on a count value of the counter.

* * * * *